United States Patent
Yoo et al.

(10) Patent No.: US 10,640,706 B2
(45) Date of Patent: May 5, 2020

(54) ETCHING COMPOSITIONS AND METHOD OF ETCHING BY USING THE SAME

(71) Applicant: OCI COMPANY LTD., Seoul (KR)

(72) Inventors: HoSeong Yoo, Siheung (KR); JunEun Lee, Seongnam (KR); PyongHwa Jang, Seoul (KR); Yongil Kim, Incheon (KR); Jin Park, Seongnam (KR)

(73) Assignee: OCI COMPANY LTD. (KR)

( * ) Notice: Subject to any disclaimer, the term of this patent is extended or adjusted under 35 U.S.C. 154(b) by 1 day.

(21) Appl. No.: 16/026,169

(22) Filed: Jul. 3, 2018

(65) Prior Publication Data

US 2019/0010398 A1    Jan. 10, 2019

(30) Foreign Application Priority Data

Jul. 6, 2017  (KR) .......................... 10-2017-0086140

(51) Int. Cl.
  *C09K 13/06* (2006.01)
  *H01L 21/311* (2006.01)

(52) U.S. Cl.
  CPC ........ *C09K 13/06* (2013.01); *H01L 21/31111* (2013.01)

(58) Field of Classification Search
  None
  See application file for complete search history.

(56) References Cited

U.S. PATENT DOCUMENTS

| | | | |
|---|---|---|---|
| 2016/0056054 A1* | 2/2016 | Takahashi | C23F 1/26 438/754 |
| 2016/0257856 A1* | 9/2016 | Reiss | B24B 1/00 |
| 2017/0321121 A1* | 11/2017 | Yoo | C09K 13/08 |

FOREIGN PATENT DOCUMENTS

| KR | 10-2014-0079267 | 6/2014 |
|---|---|---|
| KR | 10-2017-0001801 | 1/2017 |

* cited by examiner

*Primary Examiner* — Allan W. Olsen
(74) *Attorney, Agent, or Firm* — Sheridan Ross P.C.

(57) ABSTRACT

The present invention relates to an etching composition, an etching method, and a method of preparing a semiconductor device using the same, and more particularly, to an etching composition comprising a compound capable of selectively removing a nitride film with a high selectivity while minimizing an etch rate of the oxide film, and a method of preparing a semiconductor device comprising an etching process using the etching composition.

[Formula 1]

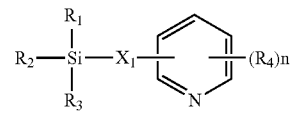

7 Claims, No Drawings

ETCHING COMPOSITIONS AND METHOD OF ETCHING BY USING THE SAME

CROSS REFERENCE TO RELATED APPLICATION

This application claims the benefit of the Republic of Korea Application No. 10-2017-0086140 filed Jul. 6, 2017, the disclosure of which are incorporated herein by reference.

TECHNICAL FIELD

The present invention relates to an etching composition and a method of etching by using the same, and more particularly, to an etching composition comprising a compound having a high selectivity ratio capable of selectively removing a nitride film while minimizing an etch rate of an oxide film, and an etching method of semiconductor devices by using the etching composition.

BACKGROUND ART

In the semiconductor manufacturing process, oxide films such as a silicon oxide film ($SiO_2$), etc. and nitride films such as a silicon nitride film ($SiN_x$), etc. are used as typical insulating films, by which each of them is laminated or at least a film is alternately laminated. The silicon nitride film is in contacted with surfaces of a silicon oxide film, a polysilicon film, or a silicon wafer and is deposited via a CVD (Chemical Vapor Deposition) process and is removed by dry etching and wet etching. Among these etching using phosphoric acid is widely used.

In wet etching process for removing the silicon nitride film, a mixture of phosphoric acid and deionized water is generally used. The deionized water is added in order to prevent the decrease of the etch rate and the change of the etching selectivity to the oxide film, however there is a problem that defects are caused in the process of removing nitride film by etching even with a minute change in the amount of deionized water to be supplied. In addition, phosphoric add is corrosive as a strong acid and has difficulty in handling.

In order to solve this problem, there has been disclosed a method of removing a nitride film by using an etching composition containing hydrofluoric acid (HF) or nitric acid ($HNO_3$) to phosphoric acid ($H_3PO_4$), however, rather, the etch rate of the oxide film increases and the etching selectivity of the nitride film and the oxide film is decreased.

In addition, a technique using trisilanol to lower the etch rate of the oxide film is disclosed, when trisilanol is used, there is a problem that many particles are generated after the etching process and the recycling of the phosphoric acid cannot possible.

The reason why particles are generated when trisilanol is used is that trisilanol groups in phosphoric acid react with each other to change into a Si—O—Si form and increase in size. At this time, it is desirable that the groups react to each other constantly and the particle size is uniform, but particles of various sizes are generated thereby generating particle size of at least 0.05 μm and greater than 200 μm. When the generated particles are deposited on a wafer, the wafer is defective.

Therefore, to overcome the above mentioned problems, there is a need to develop an etching composition having a new composition that prevents particles from being generated while selectively etching the silicon nitride film in respect of the silicon oxide film.

SUMMARY OF THE DISCLOSURE

An object of the present invention is to provide an etching composition having a high etching selectivity of a silicon nitride film to a silicon oxide film in a semiconductor process.

Another object of the present invention is to provide an etching composition having improved silicon nitride film etch rate in silicon wafer etching.

Another object of the present invention is to provide an etching composition for controlling the size of particles that can occur in a step of washing a wafer after etching.

Another object of the present invention is to provide a method of etching by using the etching composition.

The objects of the present invention are not limited thereto and that various changes and modifications may be made without departing from the spirit and scope of the invention.

An aspect of the present invention provides an etching composition comprising:
phosphoric acid; and
a compound represented by Formula 1,

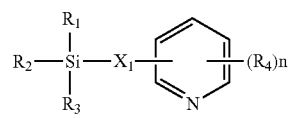

[Formula 1]

in Formula 1,
n is an integer of 0 to 4,
$R_1$ to $R_3$ are each independently selected from the group consisting of hydrogen, halogen, hydroxy group, $C_1$-$C_{10}$ alkyl group and $C_3$-$C_{10}$ cycloalkyl group, at least one of $R_1$ to $R_3$ is hydroxy group,
$R_4$ is selected from the group consisting of hydrogen, halogen, $C_1$-$C_{10}$ alkyl group and $C_3$-$C_{10}$ cycloalkyl group,
$X_1$ is —$(C(R_5)(R_6))_m$—,
m is 0 to 3, and
$R_5$ and $R_6$ are each independently selected from the group consisting of hydrogen, $C_1$-$C_{10}$ alkyl group and $C_3$-$C_{10}$ cycloalkyl group.

Another aspect of the present invention provides a method of etching by using the etching composition.

DETAILED DESCRIPTION OF THE EMBODIMENTS

Hereinafter, the present invention will be described in detail.

The present invention is not limited to the embodiments described below and may be embodied in various aspects.

The following definitions are definitions of various terms used to describe the present invention. These definitions are used only to illustrate specific embodiments, unless otherwise specified, and are not intended to limit the invention.

The term of alkyl in the present invention is a monovalent substituent derived from a linear or branched saturated hydrocarbon having 1 to 10 carbon atoms unless specifically mentioned, and the linear or branched alkyl group has 10 or less carbon atoms in its main chain (for example, $C_1$-$C_{10}$ linear chain, $C_3$-$C_{10}$ branched chain), preferably 4 or less, and more preferably 3 or less carbon atoms. Examples of alkyl include methyl, ethyl, propyl, isopropyl, butyl, isobutyl, sec-butyl, tert-butyl, pentyl, hexyl, etc. but are not limited thereto.

The term of cycloalkyl in the present invention means a cyclic saturated hydrocarbon derived from a monocyclic or polycyclic non-aromatic hydrocarbon having 3 to 10 carbon atoms unless specifically mentioned. Examples of such cycloalkyl include, cyclopropyl, cyclopentyl, cyclohexyl, bicyclo[2,1,1]hexyl, bicyclo [2,2,1]heptyl, etc., but are not limited thereto. In the present invention, the cycloalkyl may have 3, 4, 5, 6 or 7 carbon atoms in its ring.

The present invention provides an etching composition comprising phosphoric acid and a compound represented by Formula 1.

[Formula 1]

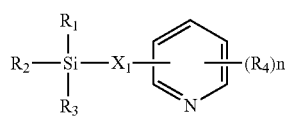

In Formula 1, n is an integer of 0 to 4, $R_1$ to $R_3$ are each independently selected from the group consisting of hydrogen, halogen, hydroxy group, $C_1$-$C_{10}$ alkyl group and $C_3$-$C_{10}$ cycloalkyl group, at least one of $R_1$ to $R_3$ is hydroxy group, $R_4$ is selected from the group consisting of hydrogen, halogen, $C_1$-$C_{10}$ alkyl group and $C_3$-$C_{10}$ cycloalkyl group, $X_1$ is —$(C(R_5)(R_6))_m$—, m is 0 to 3, and $R_5$ and $R_6$ are each independently selected from the group consisting of hydrogen, $C_1$-$C_{10}$ alkyl group and $C_3$-$C_{10}$ cycloalkyl group.

In an embodiment of the invention, $R_1$ to $R_3$ may be selected from the group consisting of hydrogen, halogen, hydroxy group and $C_1$-$C_{10}$ alkyl group, at least one of $R_1$ to $R_3$ is hydroxy group, $R_4$ is selected from the group consisting of hydrogen, halogen and $C_1$-$C_5$ alkyl group, $X_1$ is —$(C(R_5)(R_6))_m$—, m is 0 to 1, and $R_5$ and $R_6$ are each independently hydrogen or $C_1$-$C_5$ alkyl group, preferably, $R_5$ and $R_6$ each independently may be selected from the group consisting of methyl group, ethyl group, propyl group, butyl group and pentyl group.

In an embodiment of the invention, all of $R_1$ to $R_3$ may be hydroxy groups.

In an embodiment of the invention, the compound represented by Formula 1 may be at least one selected from the group consisting of (2-(pyridin-4-yl)propane-2-yl)silanetriol, (3-pyridin-4-yl)pentan-3-yl)silanetriol, (3,5-dimethylpyridin-4-yl)silanetriol and (2-(3,5-dimethylpyridin-4-yl)propan-2-yl)silanetriol.

According to one embodiment of the present invention, the etching composition in which the compound represented by Formula 1 is added to phosphoric acid can selectively remove the nitride film while minimizing the etch rate of the oxide film.

More specifically, according to one embodiment of the present invention, the etch rate of the silicon nitride film of the etching composition comprising the compound of Formula 1 is 70 to 90 Å/min, and the etch rate of the silicon oxide film is 0.05 to 5 Å/min. At this time, the selectivity ratio of the silicon nitride film/oxide film according to the present invention is at least 80 so that the nitride film can be selectively removed while minimizing the etch rate of the oxide film.

In addition, the etching composition of the present invention has excellent stability at high temperature and particle generation can be prevented to improve characteristics of the device.

Representative contaminants on the wafer surface during semiconductor device process can include particles. The etching principle of etching composition containing silicon which is conventionally known is to change a silicon-hydroxy group (Si—OH) into a silicon-oxygen-silicon (Si—O—Si) form in a silicon-containing compound having a hydroxyl group to form a protective film from the etching. In this case, the etching of the oxide film can be suppressed, but the silicon compound in the phosphoric acid and the silicon impurity after the etching meet each other and the particles are easily formed.

In order to avoid this problem, the etching composition of the present invention can be prepared by introducing a bulky pyridine group in the silicon-containing compound so that it is difficult to bond silicon-hydroxy groups to each other and to form silicon-oxygen-silicon (Si—O—Si) due to the steric hindrance of the pyridine group and the generation of particles can be suppressed and the size of the generated particles can be remarkably reduced.

In one embodiment of the present invention, the etching composition may comprise 0.1 to 3% by weight, preferably 0.15 to 2.5% by weight, more preferably 0.3 to 1.5% by weight of the compound represented by Formula 1.

When the content of the compound represented by Formula 1 is less than 0.1% by weight, the stability of the etching process at a high temperature is not maintained and foreign matters can be generated. Further, when the compound represented by Formula 1 is added in an amount of more than 3% by weight, there is a problem that it is difficult to produce an etching composition because silicon particles are aggregated on a wafer due to an increase in manufacturing cost and an increase in viscosity by a polymer.

According to an embodiment of the present invention, the composition may comprise 80 to 90% by weight of phosphoric acid and 0.1 to 3% by weight of the compound represented by Formula 1. More preferably, the phosphoric acid may comprise in an amount of 80 to 90% by weight, preferably 85 to 90% by weight, more preferably 87 to 90% by weight.

When the etching composition contains phosphoric acid in an amount of less than 80% by weight, the etch rate of the silicon nitride film can be decreased and the nitride film cannot be easily removed. When the etching composition contains more than 90% by weight of phosphoric acid, the concentration of phosphoric acid becomes too high and rather the etch rate may be lowered.

Accordingly, when phosphoric acid and the compound represented by the Formula 1 are comprised in the range of weight % according to the present invention, the etching composition achieves a high silicon oxide/nitride film selectivity and an improved silicon nitride film etch rate while maintaining an appropriate level of stability in semiconductor process, thereby performing a stable etching process.

In one embodiment of the present invention, the etching composition may further comprise an additive for improving the etch rate.

The additive refers to any additive conventionally used in the art to improve the etching performance, including surfactants, metal ion sequestrants, or corrosion inhibitors and the like.

In particular, in case that an additive for improving the etch rate is included, it is preferable to contain at least 0.5% by weight of the compound represented by the Formula 1 in terms of high selectivity.

According to another embodiment of the present invention, the etching composition of the present invention may be prepared as follows.

The etching composition is prepared by adding the compound represented by Formula 1 to phosphoric acid. At this time, the concentration of the compound represented by Formula 1 in the etching composition is 100 PPM to 20,000 PPM, preferably 500 PPM to 3,000 PPM.

Another embodiment of the present invention provides a method of etching a silicon thin film using the etching composition.

An embodiment of the present invention provides an etching method comprising etching silicon nitride film, silicon oxide film and combinations thereof using the etching composition.

An embodiment of the present invention provides a method of manufacturing a semiconductor device comprising an etching by using the etching composition.

In the present invention, the etching process is performed by selectively etching of a silicon nitride film with respect to a silicon oxide film and is performed at a temperature of 140 to 195° C. and known methods can be used as other processes, thus a detailed description is omitted.

Hereinafter, specific examples of the present invention will be presented. However, the present invention may be embodied in many different aspects and is not limited to Examples described herein.

EXAMPLE

Examples 1 to 4

Preparation of Etching Composition

The compound represented by Formula 1 was added to phosphoric acid to prepare an etching composition having an initial concentration of 2,000 ppm.

The etching compositions according to Examples 1 to 4 and Comparative Example 1 are shown in Table 1.

TABLE 1

| | Etching composition | Compound of Formula 1 |
|---|---|---|
| Example 1 | Phosphoric acid (85 wt % aqueous solution) + (2-(pyridin-4-yl)propan-2-yl)silanetriol (0.2 wt %) | 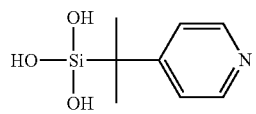 |
| Example 2 | Phosphoric acid (85 wt % aqueous solution) + (3-(pyridin-4-yl)pentan-3-yl)silanetriol (0.2 wt %) | 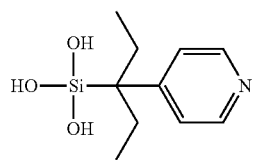 |
| Example 3 | Phosphoric acid (85 wt % aqueous solution) + (3,5-dimethylpyridin-4-yl)silanetriol (0.2 wt %) | 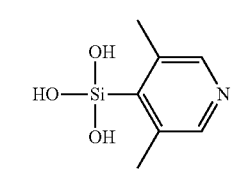 |
| Example 4 | Phosphoric acid (85 wt % aqueous solution) + (2-(3,5-dimethylpyridin-4-yl)propan-2-yl)silanetriol (0.2 wt %) | 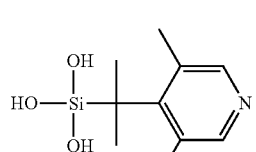 |
| Comparative Example 1 | Phosphoric acid (85 wt % aqueous solution) + Methylsilanetriol (0.2 wt %) | 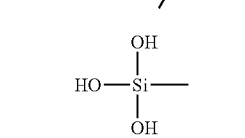 |

[Measurement of Physical Properties]

A thermal oxide film (thermal $SiO_x$) was etched using etching compositions prepared according to the above Examples and Comparative Examples for 1 minute at 165° C.

The etch rate was measured five times in total and the average result values were shown in Table 2 below.

TABLE 2

| | Thickness before etching (Å) | Thickness after etching (Å) | Etch rate (Å/min) |
|---|---|---|---|
| Example 1 | 1041.42 | 1041.01 | 0.41 |
| Example 2 | 1041.56 | 1041.06 | 0.50 |
| Example 3 | 1047.19 | 1046.42 | 0.77 |
| Example 4 | 1043.19 | 1042.67 | 0.52 |
| Comparative Example 1 | 1045.13 | 1041.55 | 3.58 |

As shown in the above Table 2, the etching compositions of Examples 1 to 4 were confirmed to have a very low etch rate for the silicon oxide film.

On the other hand, the etching composition of Comparative Example 1 had a high etch rate for the silicon oxide film.

[Measurement of Etch Rate]

A silicon nitride film substrate was etched by the etching compositions prepared according to the above Examples and Comparative Examples at different etching temperatures.

The silicon nitride film was planarized before adding the etching composition, and the planarization process was performed by immersing the same in a diluted hydrofluoric acid for 30 seconds after diluting 50 wt % of hydrofluoric acid with 200:1.

The etch rate was determined by etching the silicon nitride films for 300 seconds using a Nano-View (SE MG-1000; Ellipsometry), dividing the difference between the thickness before etching and the thickness after etching by the etching time.

The results of the etch rate according to time are shown in Table 3 below.

TABLE 3

| Examples | Process temperature (° C.) | Nitride film etch rate (Å/min) | Oxide film etch rate (Å/min) | Selectivity ratio (nitride film/oxide film) |
|---|---|---|---|---|
| Example 1 | 165 | 72.31 | 1.05 | 68.87 |
|  |  | 73.43 | 1.15 | 63.85 |
| Example 2 | 165 | 78.89 | 1.23 | 64.13 |
|  |  | 76.11 | 1.33 | 57.22 |
| Example 3 | 165 | 75.19 | 2.01 | 37.40 |
|  |  | 76.67 | 1.89 | 40.56 |
| Example 4 | 165 | 80.00 | 1.12 | 71.43 |
|  |  | 81.12 | 1.08 | 75.11 |
| Comparative Example 1 | 165 | 79.66 | 0.98 | 81.29 |
|  |  | 78.96 | 1.01 | 78.19 |

As shown in the above Table 3, it was seen that the etching compositions of Examples 1 to 4 increased the etch rate of the nitride film and suppressed the etch rate of the oxide film.

This reflects a high selectivity of the etching composition according to the present invention, and the effect of the present invention can be confirmed in the silicon etching process.

[Measurement of Particle Size]

Etching was performed using the etching compositions prepared according to the above Examples and Comparative Examples. The size of particles generated after etching was measured using PSA (particle size analyzer), and It is checked whether or not particles having a particle size of more than 200 μm and less than 10 μm are generated and its particle size were measured, and the results are shown in Table 4 below.

TABLE 4

| Examples | Particles larger than 200 μm | Particles smaller than 10 μm |
|---|---|---|
| Example 1 | Not found | 0.4 μm, 1.3 μm |
| Example 2 | Not found | 0.3 μm, 1.0 μm |
| Example 3 | Not found | 0.6 μm, 1.5 μm |
| Example 4 | Not found | 0.8 μm, 1.0 μm |
| Comparative Example 1 | Many found (203.78 μm, 255.78 μm) | Not found |

As shown in the above Table 4, the etching compositions of Examples 1 to 4 were confirmed to generate particles having a significantly small size and uniform size after etching. This represents that the etching composition of the present invention inhibits particle formation due to steric hindrance and also significantly reduces the size of the particles formed.

On the other hand, the etching composition of Comparative Example 1 showed that a large amount of large or small particles were found.

INDUSTRIAL APPLICABILITY

The present invention can suppress the etching of the silicon oxide film and selectively etch the silicon nitride film by providing the etching composition in which the compound represented by the Formula 1 is added to phosphoric acid.

The etching composition of the present invention has an excellent stability at high temperature and can prevent particle generation and improve device characteristics.

Further, the etching method using the etching composition of the present invention can use repeatedly phosphoric acid, thereby reducing the processing cost.

What is claimed is:

1. An etching composition comprising:
phosphoric acid; and
a compound represented by Formula 1,

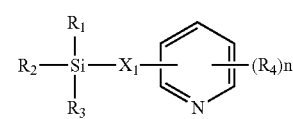

[Formula 1]

in Formula 1, n is an integer of 0 to 4, $R_1$ to $R_3$ are each independently selected from the group consisting of hydrogen, halogen, hydroxy group, $C_1$-$C_{10}$ alkyl group and $C_3$-$C_{10}$ cycloalkyl group, at least one of $R_1$ to $R_3$ is hydroxy group, $R_4$ is selected from the group consisting of hydrogen, halogen, $C_1$-$C_{10}$ alkyl group and $C_3$-$C_{10}$ cycloalkyl group, $X_1$ is $-(C(R_5)(R_6))_m-$, m is 1 to 3, and $R_5$ and $R_6$ are each independently selected from the group consisting of hydrogen, $C_1$-$C_{10}$ alkyl group and $C_3$-$C_{10}$ cycloalkyl group.

2. The etching composition of claim 1, wherein $R_1$ to $R_3$ are selected from the group consisting of hydrogen, halogen, hydroxy group and $C_1$-$C_{10}$ alkyl group, at least one of $R_1$ to $R_3$ is hydroxy group, $R_4$ is selected from the group consisting of hydrogen, halogen and $C_1$-$C_5$ alkyl group, $X_1$ is $-(C(R_5)(R_6))_m-$, m is 1, and $R_5$ and $R_6$ are each independently hydrogen or $C_1$-$C_5$ alkyl group.

3. The etching composition of claim 2, wherein all of $R_1$ to $R_3$ are hydroxy groups.

4. The etching composition of claim 3, wherein the compound represented by Formula 1 is at least one selected from the group consisting of (2-(pyridin-4-yl)propan-2-yl)silanetriol, (3-pyridin-4-yl)pentan-3-yl)silanetriol, and (2-(3,5-dimethylpyridin-4-yl)propan-2-yl)silanetriol.

5. The etching composition of claim 1, which comprises 80 to 90% by weight of phosphoric acid and 0.1 to 3% by weight of the compound represented by Formula 1.

6. The etching composition of claim 1, further comprising an additive for improving etch rate.

7. A method of etching a semiconductor device, comprising etching a film selected from the group consisting of a silicon nitride film, a silicon oxide film and combinations thereof, by using the etching composition of claim 1.

\* \* \* \* \*